United States Patent
Shigematsu et al.

(10) Patent No.: US 7,994,451 B2
(45) Date of Patent: Aug. 9, 2011

(54) LASER BEAM PROCESSING MACHINE

(75) Inventors: Koichi Shigematsu, Tokyo (JP); Seiji Miura, Tokyo (JP)

(73) Assignee: Disco Corporation, Tokyo (JP)

( * ) Notice: Subject to any disclaimer, the term of this patent is extended or adjusted under 35 U.S.C. 154(b) by 1627 days.

(21) Appl. No.: 11/290,988

(22) Filed: Dec. 1, 2005

(65) Prior Publication Data
US 2006/0119691 A1 Jun. 8, 2006

(30) Foreign Application Priority Data
Dec. 7, 2004 (JP) ................................ 2004-354558

(51) Int. Cl.
*H01L 21/46* (2006.01)
*H01L 21/02* (2006.01)
(52) U.S. Cl. ............... 219/121.68; 438/463; 219/121.83
(58) Field of Classification Search .......... 219/121.67–121.69, 121.72, 121.82, 219/121.83; 347/253; 438/463
See application file for complete search history.

(56) References Cited

U.S. PATENT DOCUMENTS

| | | | | |
|---|---|---|---|---|
| 4,929,951 A | * | 5/1990 | Small | 342/179 |
| 5,012,069 A | * | 4/1991 | Arai | 219/121.62 |
| 5,262,612 A | * | 11/1993 | Momany et al. | 219/121.67 |
| 5,432,422 A | * | 7/1995 | Nagano et al. | 318/611 |
| 6,285,002 B1 | * | 9/2001 | Ngoi et al. | 219/121.73 |
| 6,392,192 B1 | * | 5/2002 | Cole et al. | 219/121.83 |
| 6,849,824 B2 | * | 2/2005 | Arai et al. | 219/121.7 |
| 7,311,778 B2 | * | 12/2007 | Im et al. | 117/200 |
| 2003/0192867 A1 | * | 10/2003 | Yamazaki et al. | 219/121.78 |
| 2004/0164061 A1 | | 8/2004 | Takeuchi et al. | |
| 2005/0236378 A1 | * | 10/2005 | Boyle et al. | 219/121.67 |
| 2005/0258152 A1 | * | 11/2005 | Kawamoto et al. | 219/121.62 |

FOREIGN PATENT DOCUMENTS

| | | | |
|---|---|---|---|
| JP | 56-9090 | | 1/1981 |
| JP | 62-24885 | | 2/1987 |
| JP | 63-68285 | | 3/1988 |
| JP | 408187584 A | * | 7/1996 |
| JP | 2001-259876 | | 9/2001 |
| JP | 2002-273584 | | 9/2002 |
| JP | 2002-273585 | | 9/2002 |
| JP | 3408805 | | 3/2003 |
| JP | 2003-320466 | | 11/2003 |

OTHER PUBLICATIONS

Patent Abstract of Japan, Pub. No. 2002192370, Oct. 7, 2002.

* cited by examiner

*Primary Examiner* — Samuel M Heinrich

(74) *Attorney, Agent, or Firm* — Smith, Gambrell & Russell, LLP

(57) ABSTRACT

A laser beam processing machine comprising a chuck table for holding a workpiece, a laser beam application means for applying a pulse laser beam to the workpiece held on the chuck table, and a processing-feed means for processing-feeding the chuck table and the laser beam application means relative to each other, wherein the machine further comprises a feed amount detection means for detecting the processing-feed amount of the chuck table and a control means for controlling the laser beam application means based on a detection signal from the feed amount detection means, and the control means outputs an application signal to the laser beam application means for each predetermined processing-feed amount based on a signal from the feed amount detection means.

2 Claims, 8 Drawing Sheets

(a)

(b)

LASER BEAM PROCESSING MACHINE

FIELD OF THE INVENTION

The present invention relates to a laser beam processing machine for applying a laser beam along dividing lines formed on a workpiece.

DESCRIPTION OF THE PRIOR ART

In the production process of a semiconductor device, a plurality of areas are partitioned by dividing lines called "streets" arranged in a lattice pattern on the front surface of a substantially disk-like semiconductor wafer, and a circuit such as IC or LSI is formed in each of the partitioned areas. Individual semiconductor chips are manufactured by cutting this semiconductor wafer along the dividing lines to divide it into the areas each having a circuit formed thereon. An optical device wafer comprising gallium nitride-based compound semiconductors laminated on the front surface of a sapphire substrate is also cut along dividing lines to be divided into individual optical devices such as light emitting diodes or laser diodes, which are widely used in electric appliances.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means has a spindle unit comprising a rotary spindle, a cutting blade mounted on the spindle and a drive mechanism for rotary-driving the rotary spindle. The cutting blade is composed of a disk-like base and an annular cutting-edge which is mounted on the side wall peripheral portion of the base and formed as thick as about 20 μm by fixing diamond abrasive grains having a diameter of about 3 μm to the base by electroforming.

Since a sapphire substrate, silicon carbide substrate, etc. have high Mohs hardness, cutting with the above cutting blade is not always easy. Further, as the cutting blade has a thickness of about 20 μm, the dividing lines for partitioning devices must have a width of about 50 μm. Therefore, in the case of a device measuring 300 μm×300 μm, the area ratio of the streets to the device becomes 14%, thereby reducing productivity.

As a means of dividing a plate-like workpiece such as a semiconductor wafer, a laser processing method for applying a pulse laser beam of a wavelength capable of passing through the workpiece with its focusing point set to the inside of the area to be divided is also attempted nowadays, and disclosed by Japanese Patent No. 3408805, for example. In the dividing method making use of this laser processing technique, the workpiece is divided by applying a pulse laser beam of an infrared range capable of passing through the workpiece to it from one surface side of the workpiece with its focusing point set to the inside to continuously form a deteriorated layer in the inside of the workpiece along the dividing lines, and exerting external force along the dividing lines whose strength has been reduced by the formation of the deteriorated layers.

The laser beam processing machine for carrying out the above laser processing has a chuck table for holding a workpiece, a laser beam application means for applying a pulse laser beam to the workpiece held on the chuck table, and a processing-feed means for processing-feeding the chuck table and the laser beam application means relative to each other.

The chuck table of the above laser beam processing machine is processing-fed at a feed rate shown in FIG. 11. In FIG. 11, the horizontal axis shows a processing-feed amount of the chuck table and the vertical axis shows a processing-feed rate of the chuck table. As shown in FIG. 11, the processing-feed rate of the chuck table is accelerated from a processing-feed start position (m0) and reaches a predetermined processing-feed rate (V) at a first processing-feed position (m1). Then, the chuck table moves at a predetermined processing-feed rate (V), and when its processing-feed rate reaches a second processing-feed position (m2), the processing-feed rate begins to decelerate and becomes nil (0) at a processing-feed end position (m3) To carry out uniform laser processing along the dividing lines of the workpiece, however, a pulse laser beam must be applied in a state where the processing-feed rate of the chuck table is a uniform velocity. Therefore, the pulse laser beam is applied between the first processing-feed position (m1) and the second processing-feed position (m2) between which the chuck table moves at a predetermined uniform processing-feed rate (V). Consequently, the area where the laser processing is actually carried out is the area between the first processing-feed position (m1) and the second processing-feed position (m2), and the area between the processing-feed start position (m0) and the first processing-feed position (m1) between which the chuck table moves at an accelerated velocity and the area between the second processing-feed position (m2) and the processing-feed end position (m3) between which the chuck table moves with decelerated velocity become invalid stroke areas where laser processing is not carried out, thereby reducing productivity and prolonging the moving stroke of the chuck table, which impedes the downsizing of the apparatus.

SUMMARY OF THE INVENTION

It is an object of the present invention to provide a laser beam processing machine capable of carrying out uniform processing by applying a pulse laser beam to a workpiece over the entire area from the processing-feed start position up to the processing-feed end position of a chuck table.

To attain the above object, according to the present invention, there is provided a laser beam processing machine comprising a chuck table for holding a workpiece, a laser beam application means for applying a pulse laser beam to the workpiece held on the chuck table, and a processing-feed means for processing-feeding the chuck table and the laser beam application means relative to each other, wherein the machine further comprises a feed amount detection means for detecting the processing-feed amount of the chuck table and a control means for controlling the laser beam application means based on a detection signal from the feed amount detection means; and the control means outputs an application signal to the laser beam application means for each predetermined processing-feed amount based on a signal from the feed amount detection means.

Further, according to the present invention, there is also provided a laser beam processing machine comprising a chuck table for holding a workpiece, a laser beam application means for applying a pulse laser beam to the workpiece held on the chuck table, and a processing-feed means for processing-feeding the chuck table and the laser beam application means relative to each other, the processing-feed means controlling the processing-feed rate of the chuck table so as to accelerate it to reach a predetermined processing-feed rate in the course of from a processing-feed start position up to a first processing-feed amount, to maintain the predetermined processing-feed rate at the uniform velocity in the course of from the first processing-feed amount up to a second processing-feed amount, and to decelerate the processing-feed rate to nil in the course of from the second predetermined processing-feed amount up to a processing-feed end position, at the time of processing-feeding the chuck table, wherein the machine further comprises a feed amount detection means for detecting the processing-feed amount of the chuck table and a control means for controlling the laser beam application means based on a detection signal from the feed amount detection means; and the control means comprises a storage means for storing a control map for setting the processing condition of a laser beam based on the processing-feed rate for the processing-feed amount from the processing-feed start position up to the processing-feed end position of the chuck table by the processing-feed means, and outputs an application signal of the processing condition set by the control map to the laser beam application means based on a signal from the feed amount detection means.

The above control map is a frequency control map for setting a repetition frequency of a laser beam based on the processing-feed rate for the processing-feed amount from the processing-feed start position up to the processing-feed end position of the chuck table by the processing-feed means.

According to the present invention, since a pulse laser beam is applied from the laser beam application means each time the chuck table holding the workpiece is moved a predetermined processing-feed amount, even in the acceleration movement area and the deceleration movement area where the processing-feed rate of the chuck table is not constant, the pulse laser beam is applied to the workpiece at equal intervals and hence, uniform processing is carried out from the processing-feed start position up to the processing-feed end position. Therefore, the area from the processing-feed start position up to the processing-feed end position becomes the processing area and there is no invalid stroke of the chuck table, thereby making it possible to shorten the processing time and reduce the size of the whole apparatus.

Further, in the present invention, since the above control means comprises a storage means for storing a control map for setting the processing condition of a laser beam based on the processing-feed rate for the processing-feed amount from the processing-feed start position up to the processing-feed end position of the chuck table by the above processing-feed means and outputs an application signal of the processing condition set by the control map to the laser beam application means based on a signal from the above feed amount detection means, even in the acceleration movement area and the deceleration movement area where the processing-feed rate of the chuck table is not constant, the pulse laser beam of the processing condition based on the processing-feed rate is applied to the workpiece and hence, the uniform processing is carried out from the processing-feed start position up to the processing-feed end position. Consequently, the area from the processing-feed start position up to the processing-feed end position becomes the processing area and there is no invalid stroke of the chuck table, thereby making it possible to shorten the processing time and reduce the size of the whole apparatus.

DETAILED DESCRIPTION OF THE PREFERRED EMBODIMENTS

Preferred embodiments of a laser beam processing machine constituted according to the present invention will be described in detail hereinunder with reference to the accompanying drawings.

Figure 1:
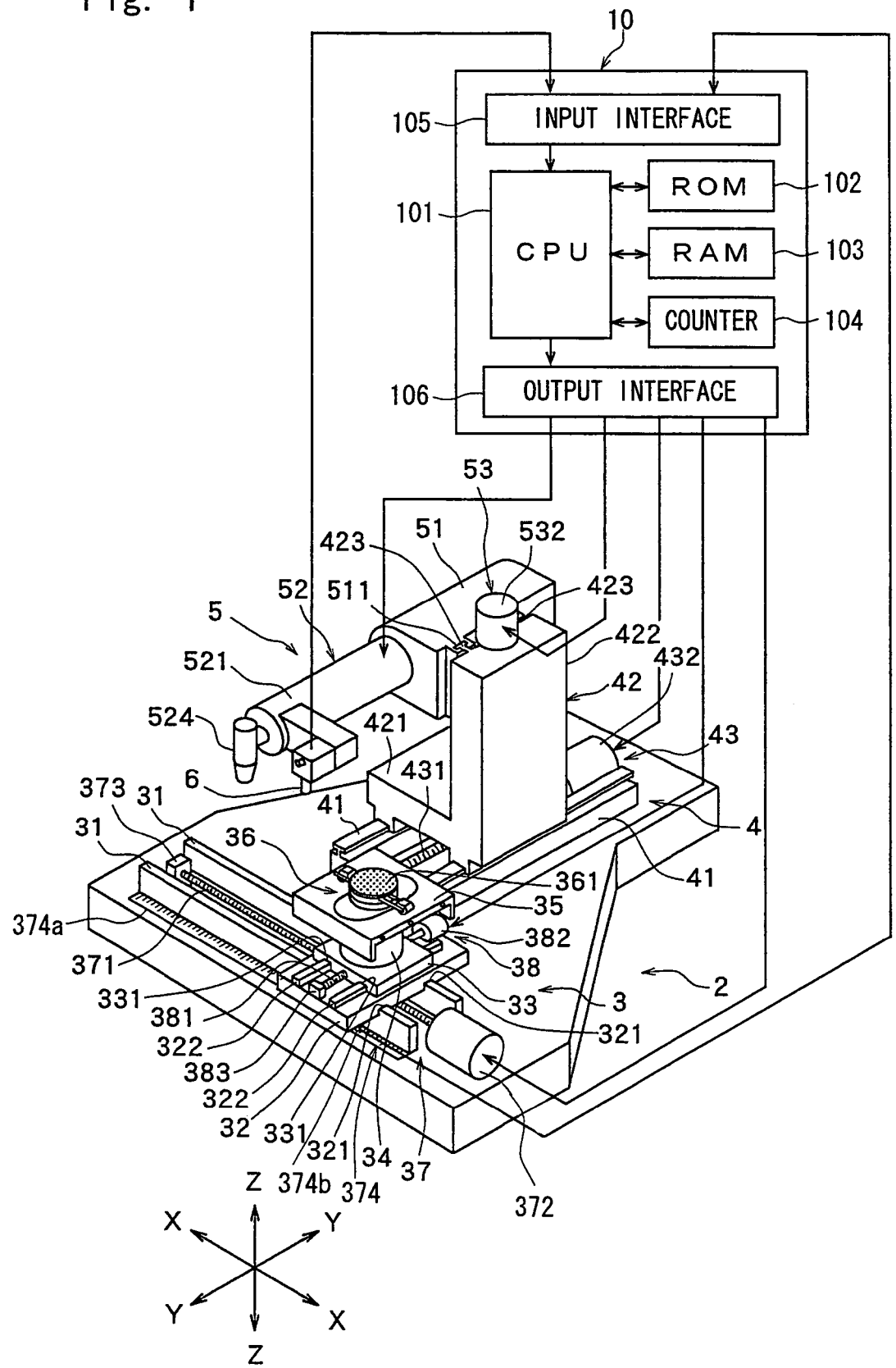
FIG. 1 is a perspective view of a laser beam processing machine constituted according to the present invention.

FIG. 1 is a perspective view of a laser beam processing machine constituted according to the present invention. The laser beam processing machine shown in FIG. 1 comprises a stationary base 2, a chuck table mechanism 3 that is mounted on the stationary base 2 in such a manner that it can move in a processing-feed direction indicated by an arrow X, and holds a workpiece, a laser beam application unit support mechanism 4 mounted on the stationary base 2 in such a manner that it can move in an indexing-feed direction indicated by an arrow Y perpendicular to the above direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31 that are mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 has an adsorption chuck 361 made of a porous material, and a disk-like semiconductor wafer as the workpiece is held on the adsorption chuck 361 by a suction means that is not shown. The chuck table 36 is turned by a pulse motor (not shown) installed in the cylindrical member 34.

The above first sliding block 32 has, on its undersurface, a pair of to-be-guided grooves 321 and 321 to be fitted to the above pair of guide rails 31 and 31 and, on its upper surface, a pair of guide rails 322 and 322 formed parallel to each other in the indexing-feed direction indicated by the arrow Y. The first sliding block 32 constituted as described above is so constituted as to be allowed to move in the processing-feed direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 includes a male screw rod 371 that is arranged between the above pair of guide rails 31 and 31 in parallel to them, and a drive source such as a pulse motor 372 for rotary-driving the male screw rod 371. The male screw rod 371 has one end that is rotatably supported to a bearing block 373 fixed on the above stationary base 2 and the other end that is transmission-coupled with the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The laser beam processing machine in the illustrated embodiment comprises a feed amount detection means 374 for detecting the processing-feed amount of the above chuck table 36. The feed amount detection means 374 comprises a linear scale 374a arranged along the guide rail 31 and a read head 374b that is mounted on the sliding block 32 and moves along the linear scale 374a together with the first sliding block 32. The read head 374b of this feed amount detection means 374 supplies a one-pulse signal each time the chuck table 36 moves 0.1 µm to a control means which will be described later, in the illustrated embodiment. The control means later described counts the input pulse signals to detect the processing-feed amount of the chuck table 36. When the pulse motor 372 is used as the drive source for the above processing-feed means 37, the processing-feed amount of the chuck table 36 can be detected by counting the drive pulses of the later-described control means for outputting a drive signal to the pulse motor 372. When a servo motor is used as the drive source for the above processing-feed means 37, a pulse signal from a rotary encoder for detecting the revolution of the servo motor is supplied to the control means, and the pulse signals input into the control means is counted to detect the processing-feed amount of the chuck table 36.

The above second sliding block 33 has, on its undersurface, a pair of to-be-guided grooves 331 and 331 to be fitted to the pair of guide rails 322 and 322 provided on the upper surface of the above first sliding block 32 and is constituted so as to be able to move in the indexing-feed direction indicated by the arrow Y by fitting the to-be-guided grooves 331 and 331 to the pair of guide rails 322 and 322, respectively. The chuck table mechanism 3 in the illustrated embodiment has a first indexing-feed means 38 for moving the second sliding block 33 in the indexing-feed direction indicated by the arrow Y along the pair of guide rails 322 and 322 provided on the first sliding block 32. The first indexing-feed means 38 includes a male screw rod 381 that is arranged between the above pair of guide rails 322 and 322 in parallel to them, and a drive source such as a pulse motor 382 for rotary-driving the male screw rod 381. The male screw rod 381 has one end that is rotatably supported to a bearing block 383 fixed on the upper surface of the above first sliding block 32 and the other end that is transmission-coupled with the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 that are mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment has a second indexing-feed means 43 for moving the movable support base 42 along the pair of guide rails 41 and 41 in the indexing-feed direction indicated by the arrow Y. This second indexing-feed means 43 includes a male screw rod 431 that is arranged between the above pair of guide rails 41 and 41 in parallel to them, and a drive source such as a pulse motor 432 for rotary-driving the male screw rod 431. The male screw rod 431 has one end that is rotatably supported to a bearing block (not shown) fixed on the above stationary base 2 and the other end that is transmission-coupled with the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 provided on the above mounting portion 422 and is supported in such a manner that it can move in the direction indicated by the arrow Z by fitting the to-be-guided grooves 511 and 511 to the above guide rails 423 and 423, respectively.

Figure 2:
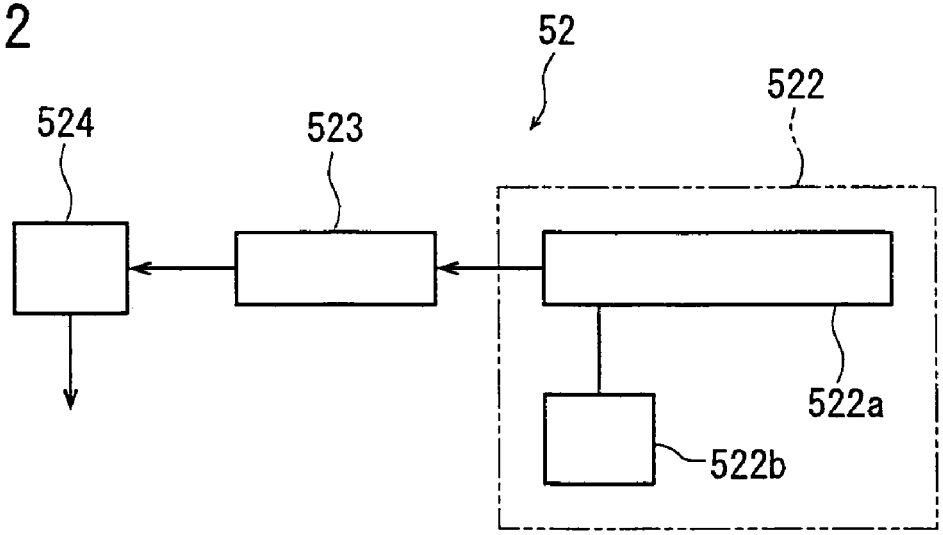
FIG. 2 is a block diagram schematically showing the constitution of a laser beam application means provided in the laser beam processing machine shown in FIG. 1.

The illustrated laser beam application means 52 has a cylindrical casing 521 that is secured to the above unit holder 51 and extends substantially horizontally. In the casing 521, there are installed a pulse laser beam oscillation means 522 and a transmission optical system 523, as shown in FIG. 2. The pulse laser beam oscillation means 522 is constituted by a pulse laser beam oscillator 522a composed of a YAG laser oscillator or YVO4 laser oscillator and a repetition frequency adjusting means 522b connected to the pulse laser beam oscillator 522a. This repetition frequency adjusting means 522b adjusts a repetition frequency oscillated by the pulse laser beam oscillator 522a based on a control signal from the control means later described. The transmission optical system 523 comprises suitable optical elements such as a beam splitter, etc. A condenser 524 housing condensing lenses (not shown) constituted by a combination of lenses that may be formation known per se is attached to the end of the above casing 521.

Figure 3:
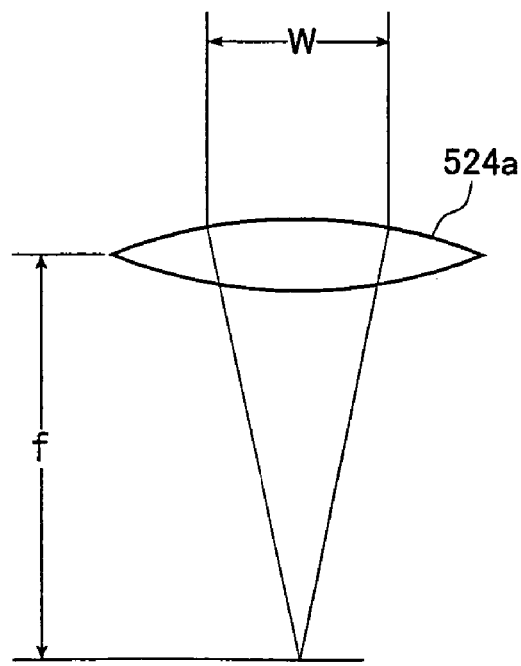
FIG. 3 is a schematic diagram explaining the focusing spot diameter of a laser beam applied from a laser beam application means shown in FIG. 2.

A laser beam oscillated from the above pulse laser beam oscillation means 522 reaches the condenser 524 through the transmission optical system 523 and is applied from the condenser 524 to the workpiece held on the above chuck table 36 at a predetermined focusing spot diameter D. This focusing spot diameter D is defined by the expression D (μm)=4×λ×f/(π×W) (wherein λ is the wavelength (μm) of the pulse laser beam, W is the diameter (mm) of the pulse laser beam entering an objective lens 524a, and f is the focusing distance (mm) of the objective lens 524a) when the pulse laser beam showing a Gaussian distribution is applied through the objective lens 524a of the condenser 524 as shown in FIG. 3.

Returning to FIG. 1, an image pick-up means 6 is attached to the front end of the casing 521 constituting the above laser beam application means 52. This image pick-up means 6 is constituted by an infrared illuminating means for applying infrared radiation to the workpiece, an optical system for capturing the infrared radiation applied by the infrared illuminating means, and an image pick-up device (infrared CCD) for outputting an electric signal corresponding to the infrared radiation captured by the optical system, in addition to an ordinary pick-up device (CCD) for picking up an image with visible radiation in the illustrated embodiment. An image signal is supplied to the control means that is not shown.

The laser beam application unit 5 in the illustrated embodiment has a moving means 53 for moving the unit holder 51 along the pair of guide rails 423 and 423 in the direction indicated by the arrow Z. The moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 are moved along the guide rails 423 and 423 in the direction indicated by the arrow Z. In the illustrated embodiment, the laser beam application means 52 is moved upward by driving the pulse motor 532 in a normal direction and moved downward by driving the pulse motor 532 in the reverse direction.

The laser beam processing machine in the illustrated embodiment has the control means 10. The control means 10 is constituted by a computer which is composed of a central processing unit (CPU) 101 for carrying out arithmetic processing based on a control program, a read-only memory (ROM) 102 for storing the control program, etc., a read/write random access memory (RAM) 103 for storing the results of operations, a counter 104, an input interface 105 and an output interface 106. Detection signals from the above feed amount detection means 374, image pick-up means 6, etc. are input to the input interface 105 of the control means 10. Control signals are output from the output interface 106 of the control means 10 to the above pulse motor 372, pulse motor 382, pulse motor 432, pulse motor 532, the laser beam application means 52, etc.

The laser beam processing machine in the illustrated embodiment is constituted as described above, and its operation will be described hereinbelow.

Figure 4:
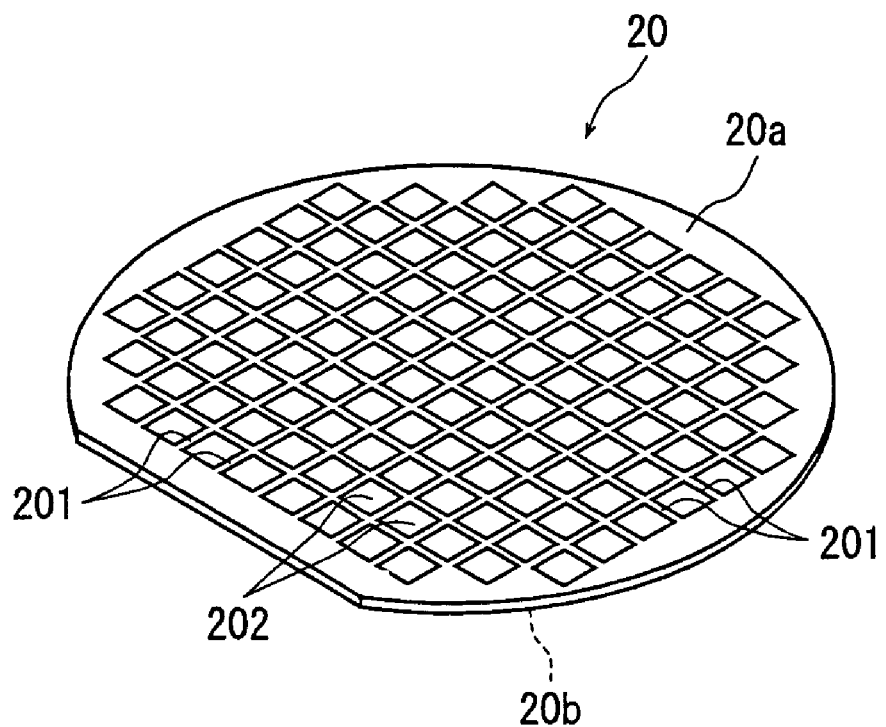
FIG. 4 is a perspective view of a semiconductor wafer as a workpiece.

FIG. 4 is a perspective view of a semiconductor wafer 20 as the workpiece to be processed by a laser beam. The semiconductor wafer 20 shown in FIG. 4 consists of a silicon wafer and has a plurality of areas partitioned by a plurality of dividing lines 201 arranged in a lattice pattern on its front surface 20a, and a circuit 202 such as IC or LSI is formed in each of the partitioned areas.

A description will be subsequently given of a first embodiment of laser processing for forming a deteriorated layer along the dividing lines 201 in the inside of the semiconductor wafer 20 by applying a laser beam along the dividing lines 201 of the above semiconductor wafer 20 by using the above laser beam processing machine.

The semiconductor wafer 20 is first placed on the chuck table 36 of the above-described laser beam processing machine shown in FIG. 1 in such a manner that the back surface 20b faces up, and is suction-held on the chuck table 36. The chuck table 36 suction-holding the semiconductor wafer 20 is brought to a position right below the image pick-up means 6 by the processing-feed means 37.

After the chuck table 36 is positioned right below the image pick-up means 6, alignment work for detecting an area to be processed by a laser beam of the semiconductor wafer 20 is carried out by the image pick-up means 6 and the control means 10. That is, the image pick-up means 6 and the control means 10 carry out image processing such as pattern matching, etc. to align a dividing line 201 formed in a predetermined direction of the semiconductor wafer 20 with the condenser 524 of the laser beam application unit 52 for applying a laser beam along the dividing line 201, thereby performing the alignment of a laser beam application position. The alignment of the laser beam application position is also carried out on dividing lines 201 formed on the semiconductor wafer 20 in a direction perpendicular to the above predetermined direction. Although the front surface 20a, on which the dividing line 201 is formed, of the semiconductor wafer 20 faces down at this point, an image of the dividing line 201 can be taken through the back surface 20b as there is provided the image pick-up means 6, that is constituted by the infrared illuminating means, the optical system for capturing infrared radiation and the image pick-up device (infrared CCD) for outputting an electric signal corresponding to the infrared radiation, as described above.

Figure 5:
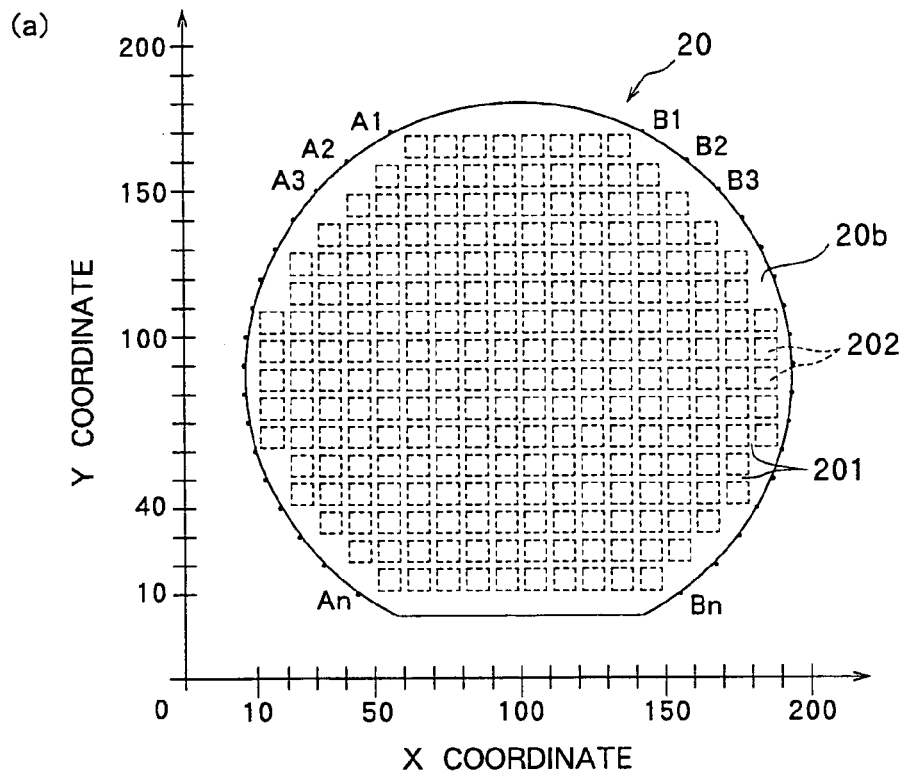
FIGS. 5(a) and 5(b) are explanatory diagrams showing the relationship of the coordinates of the semiconductor wafer shown in FIG. 4 in a state where it is held at a predetermined position of the chuck table of the laser beam processing machine shown in FIG. 1.
Figure 5:
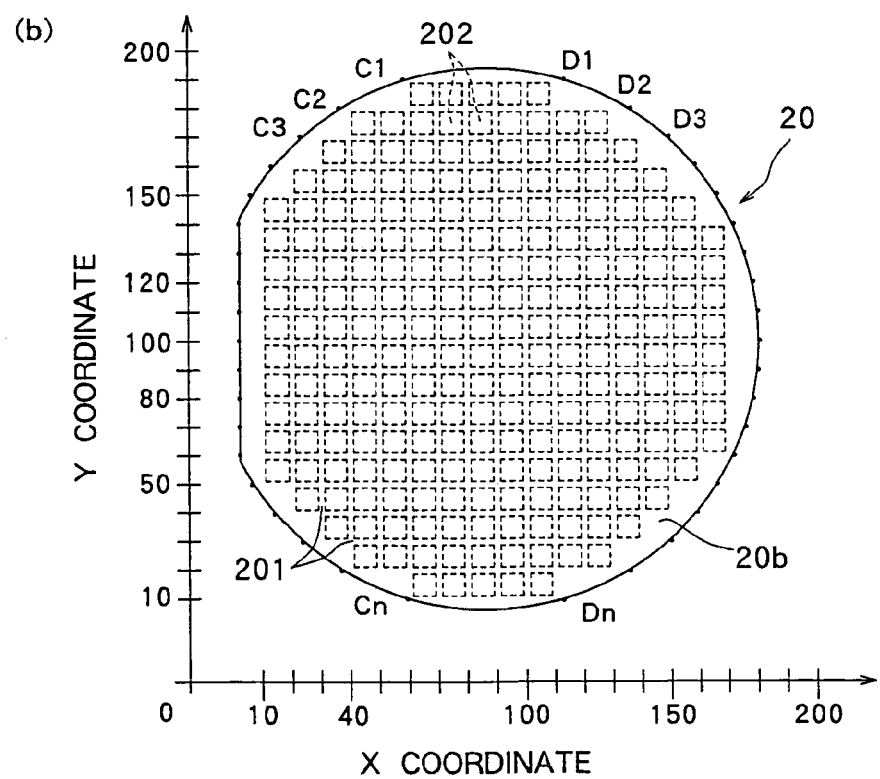

After the alignment is carried out as described above, the semiconductor wafer 20 on the chuck table 36 becomes a state of being positioned at a coordinate position shown in FIG. 5(a). FIG. 5(b) shows a state where the chuck table 36, that is, the semiconductor wafer 20, is turned at 90° from the position shown in FIG. 5(a).

Figure 6:
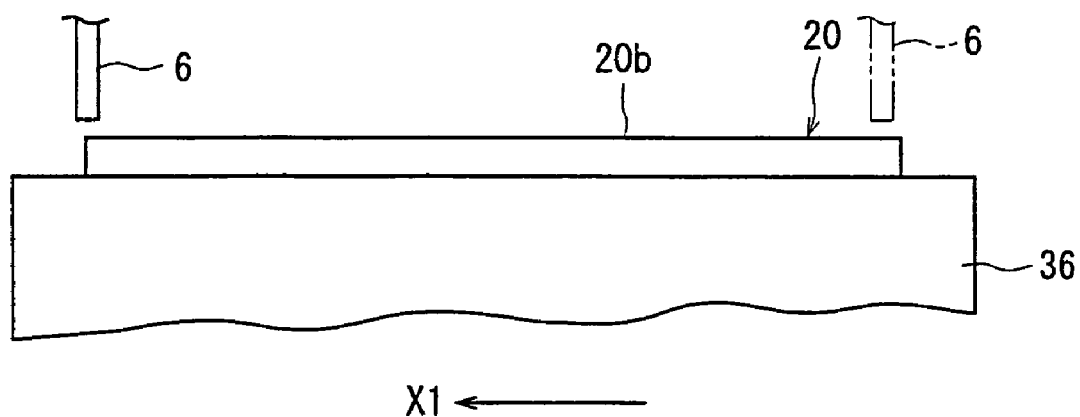
FIG. 6 is an explanatory diagram showing a dividing line detecting step carried out by the laser beam processing machine shown in FIG. 1.

After the dividing line 201 formed on the semiconductor wafer 20 held on the chuck table 36 is detected and the alignment of the laser beam application position is carried out as described above, the chuck table 36 is moved to bring the topmost dividing line 201 in FIG. 5(a) extending in the predetermined direction (right-and-left direction in FIG. 5(a)) to a position right below the image pick-up means 6. Further, then, as shown in FIG. 6, one end (left end in FIG. 6) of the above dividing line 201 is positioned right below the image pick-up means 6. After the one end (left end in FIG. 6) of the dividing line 201 is detected by the image pick-up means 6 in this state, its coordinate value (A1 in FIG. 5(a)) is supplied to the control means 10 as the coordinate value of the processing-feed start position. The chuck table 36 is then moved in the direction indicated by the arrow X1 to bring the other end (right end in FIG. 6) of the dividing line 201 to a position right below the image pick-up means 6. The image pick-up means 6 detects the other end of the dividing line 201 and supplies its coordinate value (B1 in FIG. 5(a)) to the control means 10 as the coordinate value of the processing-feed end position. The control means 10 temporarily stores the coordinate values of the processing-feed start position (A1) and the coordinate values of the processing-feed end position (B1) of the dividing line 201 in the random access memory (RAM) 103 (dividing line detection step). Accordingly, the random access memory (RAM) 103 serves as a storage means for storing the coordinate values of the processing-feed start position and the coordinate values of the processing-feed end position of the dividing line detected by the image pick-up means 6.

After the coordinate value of the processing-feed start position and the coordinate value of the processing-feed end position of the topmost dividing line 201 in FIG. 5(a) are detected as described above, the chuck table 36 is moved by a distance corresponding to the interval between the dividing lines 201 in the indexing-feed direction indicated by the arrow Y to bring the second dividing line 201 from the topmost in FIG. 5(a) to a position right below the image pick-up means 6. The above-described dividing line detecting step is carried out on the second dividing line 201 from the topmost to detect the coordinate values of the processing-feed start position (A2) and the coordinate values of the processing-feed end position (B2) of the second dividing line 201 from the topmost and temporarily store them in the random access memory (RAM) 103. Subsequently, the above-described indexing-feed step and the dividing line detecting step are carried out repeatedly up to the lowermost dividing line 201 in FIG. 5(a) to detect the coordinate values of the processing-feed start positions (A3 to An) and the coordinate values of the processing-feed end positions (B3 to Bn) of the dividing lines 201 and temporarily store them in the random access memory (RAM) 103.

After the dividing line detecting step is carried out on the dividing lines 201 extending in the predetermined direction as described above, the chuck table 36, that is, the semiconductor wafer 20 is turned at 90° to be positioned to a state shown in FIG. 5(b). Thereafter, the above-described dividing line detecting step is also carried out on dividing lines 201 extending in a direction (right-and-left direction in FIG. 5(b)) perpendicular to the dividing lines 201 extending in the above predetermined direction to detect the coordinate values of the processing-feed start positions (C1 to Cn)) and the coordinate values of the processing-feed end positions (D1 to Dn) of each of the above dividing lines 201 and temporarily store them in the random access memory (RAM) 103. As for the coordinate values of the processing-feed start positions (A1 to An) and the coordinate values of the processing-feed end positions (B1 to Bn) of the dividing lines 201 extending in the predetermined direction, formed on the semiconductor wafer 20 and the coordinate values of the processing-feed start positions (C1 to Cn) and the coordinate values of the processing-feed end positions (D1 to Dn) of the dividing lines 201 extending in the direction perpendicular to the predetermined direction, it is preferred that these design values of the semiconductor wafer 20 should be in advance stored in the read-only memory (ROM) 102 or the random access memory (RAM) 103 to omit the above-described dividing line detecting step.

Next comes a step of forming a deteriorated layer by applying a pulse laser beam along the dividing lines 201 formed on the semiconductor wafer 20.

In the deteriorated layer forming step, the chuck table 36 is first moved to bring the topmost dividing line 201 in FIG. 5(a) to a position right below the condenser 524 of the laser beam application means 52. And, the coordinate value (A1) of the processing-feed start position (see FIG. 5(a)) that is one end (left end in FIG. 7(a)) of the dividing line 201 is positioned right below the condenser 524, as shown in FIG. 7(a). The chuck table 36, that is, the semiconductor wafer 20 is then processing-fed in the direction indicated by the arrow X1 in FIG. 7(a) while a pulse laser beam of a wavelength capable of passing through the semiconductor wafer 20 as the workpiece is applied from the condenser 524. When the other end (right end in FIG. 7(a)), that is, the coordinate value (B1) of the processing-feed end position of the dividing line 201 reaches the application position of the condenser 524 of the laser beam application means 52, as shown in FIG. 7(b), the application of the pulse laser beam is suspended and the movement of the chuck table 36, that is, the semiconductor wafer 20 is stopped. In this deteriorated layer forming step, the focusing point P of the pulse laser beam is set to a position near the front surface 20a (undersurface) of the semiconductor wafer 20. As a result, a deteriorated layer 210 is exposed to the front surface 20a (undersurface) of the semiconductor wafer 20 and formed from the front surface 20a toward the inside. This deteriorated layer 210 is formed as a molten and re-solidified layer (that is, as a layer that has been once molten and then re-solidified), and has reduced strength.

Figure 8:
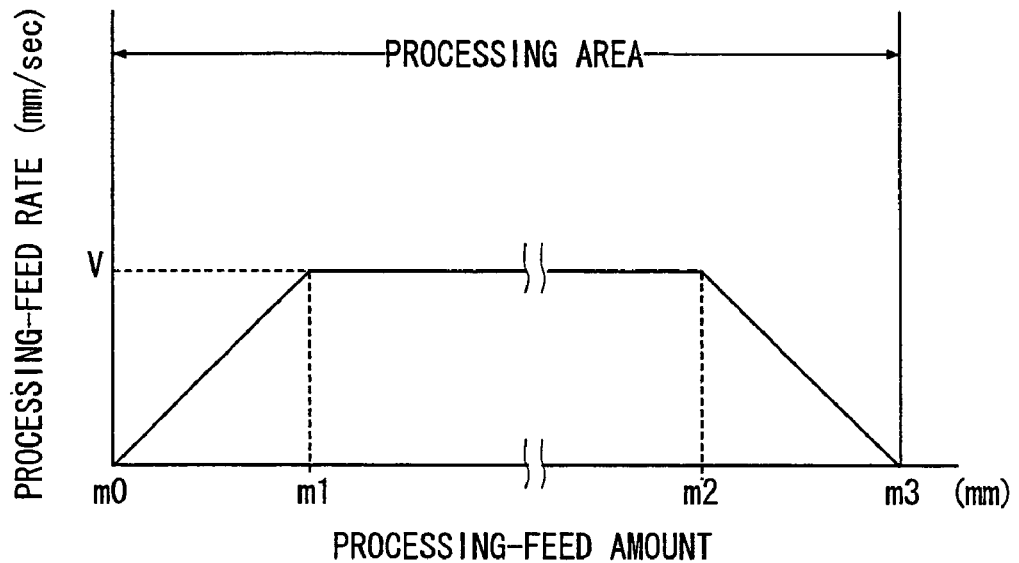
FIG. 8 is an explanatory diagram showing the relationship among the processing-feed amount and processing-feed rate of a chuck table provided in the laser beam processing machine shown in FIG. 1 and the processing area.
Figure 11:
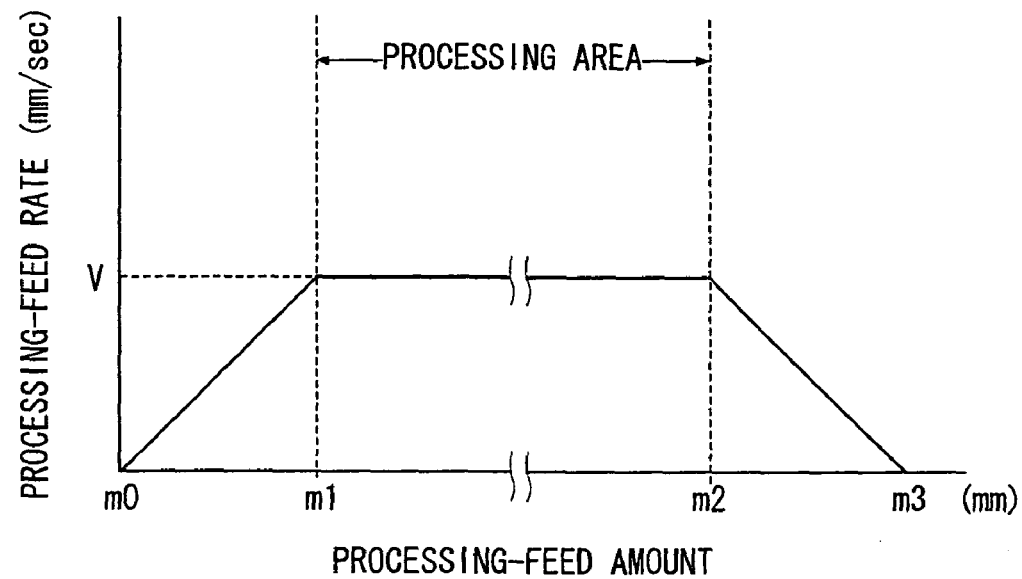
FIG. 11 is an explanatory diagram showing the relationship among the processing-feed amount and processing-feed rate of the chuck table provided in the laser beam processing machine shown in FIG. 1 and the processing area of the prior art processing method.

In the above deteriorated layer forming step, the processing-feed rate of the chuck table 36, that is, the semiconductor wafer 20, changes as shown in FIG. 8. FIG. 8 corresponds to FIG. 11, and the horizontal axis shows the processing-feed amount of the chuck table and the vertical axis shows the processing-feed rate of the chuck table. As shown in FIG. 8, the processing-feed rate of the chuck table is accelerated from the processing-feed start position (m0) and reaches a predetermined rate (V) at the first processing-feed position (m1). After the chuck table then moves at the predetermined feed rate (V) and reaches the second processing-feed position (m2), its feed rate is decelerated and becomes nil at the processing-feed end position (m3). The processing-feed amount from the processing-feed start position (m0) up to the processing-feed end position (m3) differs depending on the distances from the coordinate values (A1 to An) of the processing-feed start positions up to the coordinate values (B1 to Bn) of the processing-feed end positions of the dividing lines 201 that are formed on the semiconductor wafer 20 and extend in the predetermined direction, and the distances from the coordinate values (C1 to Cn) of the processing-feed start positions up to the coordinate values (D1 to Dn) of the processing-feed end positions of the dividing lines 201 extending in the direction perpendicular to the predetermined direction. However, the length from the processing-feed start position (m0) up to the first processing-feed position (m1) is fixed regardless of the length of the dividing line as the processing-feed rate is accelerated uniformly and the length from the second processing-feed position (m2) to the processing-feed end position (m3) is fixed regardless of the length of the dividing line as the processing-feed rate is decelerated uniformly. Therefore, the area that changes according to the length of the dividing line is the area of the length of from the first processing-feed position (m1) up to the second processing-feed position (m2).

As shown in FIG. 8, the processing speed between the processing-feed start position (m0) and the first processing-feed position (m1) between which the chuck table moves with accelerated velocity and the processing speed between the second processing-feed position (m2) and the processing-feed end position (m3) between which the chuck table moves at a decreasing velocity are lower than the predetermined processing speed between the first processing-feed position (m1) and the second processing-feed position (m2) between which the chuck table moves with uniform velocity. Therefore, when the repetition frequency of a pulse laser beam is set based on the predetermined processing speed between the first processing-feed position (m1) and the second processing-feed position (m2), the application pulses of the laser beam becomes excessive in the above acceleration movement area and the deceleration movement area.

Then, in the first embodiment of the present invention, each time the processing-feed amount of the chuck table 36, that is, the semiconductor wafer 20, becomes a predetermined value, one pulse of the laser beam is applied. That is, the control means 10 receives a pulse signal that is the detection signal of the read head 374b of the above feed amount detection means 374. The control means 10 counts the input pulses by means of the counter 104, and when the number of pulses becomes, for example, 10, an application signal is output to the laser beam application means 52. Therefore, since in the illustrated embodiment, the read head 374b outputs a one-pulse signal each time the chuck table 36, that is, the semiconductor wafer 20, moves 0.1 µm, one pulse of the laser beam is applied along the dividing line 201 of the semiconductor wafer 20 each time the chuck table 36, that is, the semiconductor wafer 20, is moved 1 µm. As a result, even in the acceleration movement area from the processing-feed start position (m0) up to the first processing-feed position (m1) and the deceleration area from the second processing-feed position (m2) up to the processing-feed end position (m3) where the processing-feed rate of the chuck table 36, that is, the semiconductor wafer 20, is not constant, a pulse laser beam is applied along the dividing line 201 of the semiconductor wafer 20 at regular intervals, whereby uniform processing is carried out from the processing-feed start position (m0) up to the processing-feed end position (m3). Consequently, as the entire area from the processing-feed start position (m0) up to the processing-feed end position (m3) becomes the processing area and hence, there is no invalid stroke of the chuck table 36, that is, the semiconductor wafer 20 in this embodiment, the processing time can be shortened and the entire apparatus can be reduced in size.

Further, when the pulse motor 372 is used as the drive source for the above processing-feed means 37, it is possible that the processing-feed amount of the chuck table 36 is detected by counting the drive pulses of the control means 10 that outputs a drive signal to the pulse motor 372 so that one pulse of the laser beam is applied each time the processing-feed amount of the chuck table 36, that is, the semiconductor wafer 20, becomes a predetermined value. That is, in the illustrated embodiment, the processing-feed means 37 is designed to move the chuck table 36 0.1 µm each time one drive pulse is applied to the pulse motor 372. Therefore, the control means 10 outputs 1,000,000 drive pulses per second to the pulse motor 372 when the predetermined processing-feed rate (V) is 100 mm/sec. And, the control means 10 counts the drive pulses output to the pulse motor 372 by means of the counter 104 and sends an application signal to the laser beam application means 52 when the number of pulses reaches 10. Therefore, one pulse of the laser beam is applied along the dividing line 201 of the semiconductor wafer 20 each time the chuck table 36, that is, the semiconductor wafer 20 is processing-fed 1 µm.

The processing conditions in the above deteriorated layer forming step are set as follows, for example.

Light source: LD excited Q switch Nd:YVO4 laser
Wavelength: pulse laser having a wavelength of 1,064 nm
Energy: 3 (J/sec)
Focusing spot diameter: 1 µm
Processing-feed rate: 100 mm/sec between the first processing-feed position (m1) and the second processing-feed position (m2)

When the semiconductor wafer 20 is thick, the above-described deteriorated layer forming processing is carried out a plurality of times by changing the above focusing point P stepwise to form a plurality of deteriorated layers 210. The deteriorated layer 210 may be formed only in the inside without being exposed to the front surface 20a and the back surface 20b.

The above deteriorated layer forming step is carried out along all the dividing lines 201 formed in the predetermined direction of the semiconductor wafer 20. Then, the chuck table 36, that is, the semiconductor wafer 20 is turned at 90° to carry out the above-described deteriorated layer forming step along dividing lines 201 extending in a direction perpendicular to the above dividing lines 201 that are formed in the predetermined direction of the semiconductor wafer 20.

A description will be subsequently given of a second embodiment of the present invention.

Figure 7:
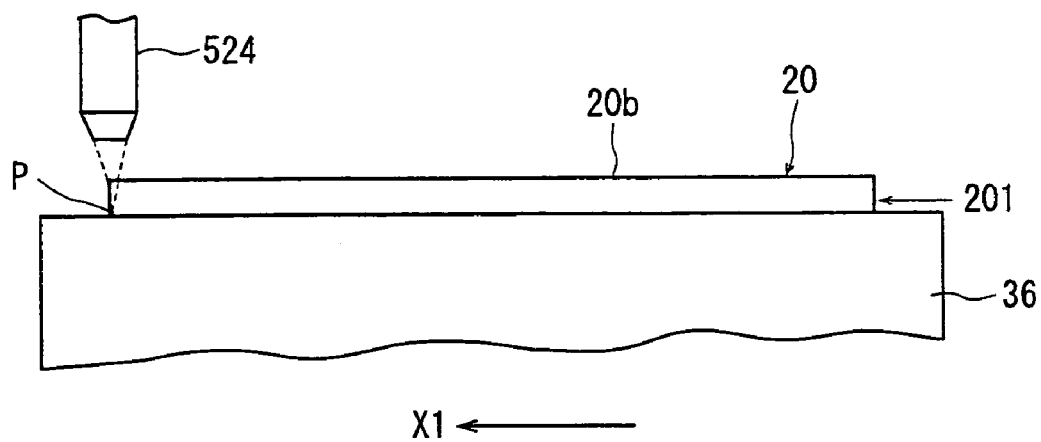
FIGS. 7(a) and 7(b) are explanatory diagrams showing a laser beam application step carried out by the laser beam processing machine shown in FIG. 1.
Figure 7:
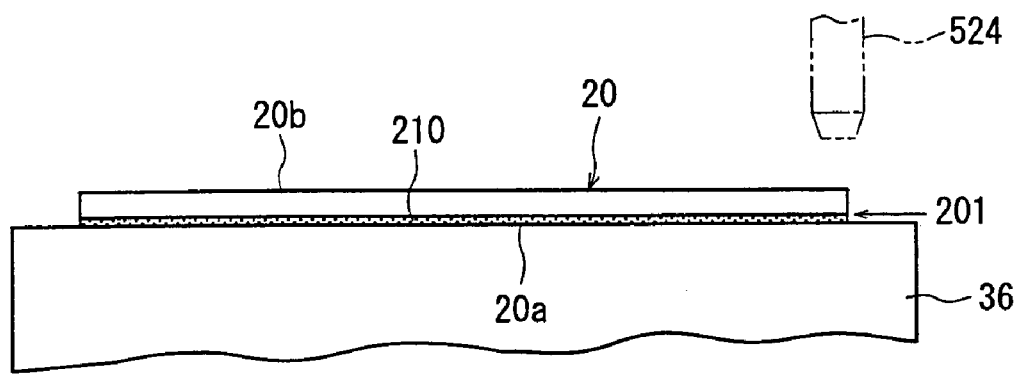
Figure 9:
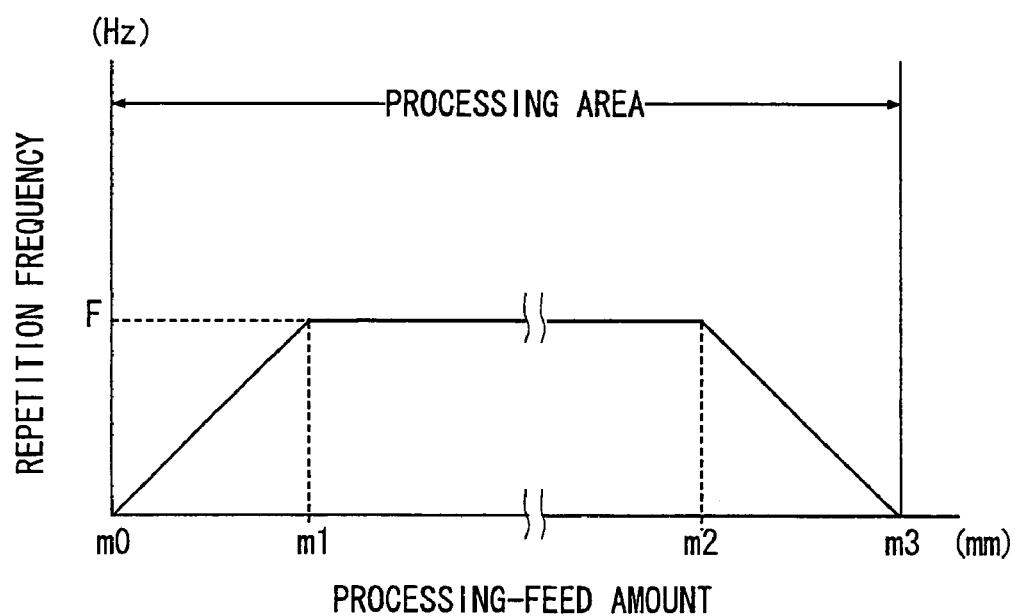
FIG. 9 is an explanatory diagram of a frequency control map stored in a control means provided in the laser beam processing machine shown in FIG. 1.

In the second embodiment, there is beforehand prepared a frequency control map, for example, shown in FIG. 9 in which the repetition frequency of a pulse laser beam for each amount of processing-feed is set based on the processing-feed rate for the processing-feed amount from the processing-feed start position up to the processing-feed end position of the chuck table 36 by the processing-feed means 37 as shown in FIG. 7. In FIG. 9, the horizontal axis shows the processing-feed amount of the chuck table and the vertical axis shows the repetition frequency of the pulse laser beam corresponding to each amount of processing-feed. In the frequency control map shown in FIG. 9, the chuck table is moved from the first processing-feed position (m1) up to the second processing-feed position (m2) at a uniform processing-feed rate, for example, 100 mm/sec, and the repetition frequency (F) of the pulse laser beam between these positions is set to 100 kHz, for example. The repetition frequencies of the pulse laser beam for the acceleration movement area from the processing-feed start position (m0) up to the first processing-feed position (m1) and the deceleration movement area from the second processing-feed position (m2) up to the processing-feed end position (m3) are set as follows.

When the uniformly accelerated movement of the chuck table 36 from the processing-feed start position (m0) up to the first processing-feed position (m1) is represented by $A(mm/s^2)$, the uniform velocity movement from the first processing-feed position (m1) up to the second processing-feed position (m2) is represented by V(mm/s), the time required for movement from the processing-feed start position (m0) up to the first processing-feed position (m1), that is, the time required for the processing-feed rate of the chuck table to reach V(mm/s) from 0 (mm/s) is represented by t, and the repetition frequency of the pulse laser beam in the uniform velocity movement area from the first processing-feed position (m1) up to the second processing-feed position (m2) is represented by F(Hz), the repetition frequency f(Hz) of the pulse laser beam in the acceleration movement area from the processing-feed start position (m0) up to the first processing-feed position (m1) is obtained from the expression $f(Hz)=(F \times A \times t)/V$. And, when the uniformly decelerated movement from the second processing-feed position (m2) up to the processing-feed end position (m3) is represented by $B(mm/s^2)$, and the time required for movement from the second processing-feed position (m2) up to the processing-feed end position (m3), that is, the time required for the processing-feed rate of the chuck table to reach 0 (mm/s) from V(mm/s) is represented by t, the frequency f(Hz) of the pulse laser beam in the deceleration movement area from the second processing-feed position (m2) up to the processing-feed end position (m3) is obtained from the expression f(Hz)=(F×B×t)/V.

The thus-prepared frequency control map as a control map for setting processing conditions is stored in the read-only memory (ROM) 102 or the random access memory (RAM) 103 of the control means 10. The control means 10 controls the repetition frequency adjusting means 522b of the pulse laser beam oscillation means 522 of the laser beam application means 52 based on the frequency control map in the above deteriorated layer forming step.

That is, in the above deteriorated layer forming step, the control means 10 grasps the processing-feed amount of the chuck table 36, that is, the semiconductor wafer 20 based on a pulse signal that is the detection signal of the read head 374b of the feed amount detection means 374 (or a drive pulse signal when the drive source for the processing-feed means 37 is the pulse motor 372 or a pulse signal from a rotary encoder when the drive source for the processing-feed means 37 is a servo motor), as described above. The control means 10 controls the repetition frequency adjusting means 522b of the pulse laser beam oscillation means 522 so as to generate a pulse laser beam having a repetition frequency corresponding to a speed accelerated at the uniformly accelerated velocity shown in FIG. 9 while the chuck table 36, that is, the semiconductor wafer 20 moves from the processing-feed start position (m0) up to the first processing-feed position (m1). When the chuck table 36, that is, the semiconductor wafer 20 reaches the first processing-feed position (m1), the control means 10 controls the repetition frequency adjusting means 522b of the pulse laser beam oscillation means 522 so as to generate a pulse laser beam having a preset wavelength of 100 kHz in the uniform velocity movement area from the first processing-feed position (m1) up to the second processing-feed position (m2) When the chuck table 36, that is, the semiconductor wafer 20 reaches the second processing-feed position (m2), the control means 10 controls the repetition frequency adjusting means 522b of the pulse laser beam oscillation means 522 so as to generate a pulse laser beam having a frequency corresponding to a speed decelerated at the uniformly decreased velocity shown in FIG. 9 while the chuck table 36, that is, the semiconductor wafer 20 moves from the second processing-feed position (m2) up to the processing-feed end position (m3).

Thus, in the second embodiment of the present invention, since the repetition frequency of the pulse laser beam is controlled based on the frequency control map in which the repetition frequency of the pulse laser beam for each amount of processing-feed is set based on the processing-feed rate for the processing-feed amount from the processing-feed start position up to the processing-feed end position of the chuck table 36, the pulse laser beam is applied to the semiconductor wafer 2b along the dividing lines 201 at regular intervals and hence, uniform processing is carried out from the processing-feed start position up to the processing-feed end position. Therefore, even in the second embodiment, the area from the processing-feed start position (m0) up to the processing-feed end position (m3) is the processing area, and there is no invalid stroke of the chuck table 36, that is, the semiconductor wafer 20, thereby making it possible to shorten the processing time and reduce the size of the whole apparatus.

Figure 10:
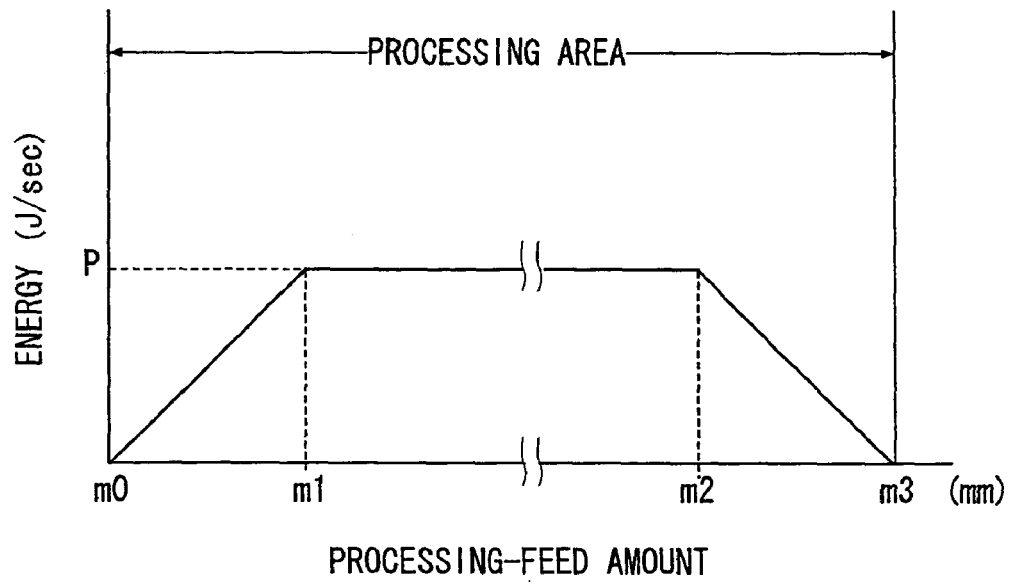
FIG. 10 is an explanatory diagram of an energy control map stored in the control means provided in the laser beam processing machine shown in FIG. 1.

In the above first and second embodiments, the number of pulses of the pulse laser beam is controlled based on the processing-feed rate of the chuck table. It is also possible, however, to make the energy of the pulse laser beam applied per unit distance along the dividing lines formed on the semiconductor wafer uniform. That is, FIG. 10 shows an energy control map in which the energy of the pulse laser beam is set as a processing condition, based on the processing-feed rate for the processing-feed amount from the processing-feed start position up to the processing-feed end position of the chuck table 36. In FIG. 10, the horizontal axis shows the processing-feed amount of the chuck table and the vertical axis shows the energy of the pulse laser beam for each amount of processing-feed. In the energy control map shown in FIG. 10, the chuck table moves from the first processing-feed position (m1) up to the second processing-feed position (m2) at a uniform velocity of, for example, 100 mm/sec, and the energy (P) of the pulse laser beam between these positions is set to 3 (J/sec), for example. And, the energy of the pulse laser beam for the acceleration movement area from the processing-feed start position (m0) up to the first processing-feed position (m1) and the deceleration movement area from the second processing-feed position (m2) up to the processing-feed end position (m3) is set as follows.

When the uniformly accelerated movement of the chuck table from the processing-feed start position (m0) up to the first processing-feed position (m1) is represented by A (mm/s$^2$), the uniform velocity movement from the first processing-feed position (m1) up to the second processing-feed position (m2) is represented by V (mm/s), the time required for movement from the processing-feed start position (m0) up to the first processing-feed position (m1), that is, the time required for the processing-feed rate of the chuck table to reach V (mm/s) from 0 (mm/s) is represented by t, and the energy of the pulse laser beam in the uniform velocity movement area from the first processing-feed position (m1) up to the second processing-feed position (m2) is represented by P (J/sec), the energy p (J/sec) of the pulse laser beam in the acceleration movement area from the processing-feed start position (m0) up to the first processing-feed position (m1) is obtained from the expression p (J/sec)=(P×A×t)/V. And, when the uniformly decelerated movement from the second processing-feed position (m2) up to the processing-feed end position (m3) is represented by B (mm/s2), and the time required for movement from the second processing-feed position (m2) up to the processing-feed end position (m3), that is, the time required for the processing-feed rate of the chuck table to reach 0 (mm/s) from V (mm/s) is represented by t, the energy p (J/sec) of the pulse laser beam in the deceleration movement area from the second processing-feed position (m2) up to the processing-feed end position (m3) is obtained from the expression p (J/sec)=(P×B×t)/V.

The thus-prepared energy control map is stored in the read-only memory (ROM) 102 or the random access memory (RAM) 103 of the control means 10. The control means 10 controls the pulse laser beam oscillation means 522 of the laser beam application means 52 based on the energy control map in the above-described deteriorated layer forming step.

That is, in the above deteriorated layer forming step, the control means 10 grasps the processing-feed amount of the chuck table 36, that is, the semiconductor wafer 20 based on a pulse signal that is the detection signal of the read head 374b of the feed amount detection means 374 (or a drive pulse signal when the drive source for the processing-feed means 37 is the pulse motor 372 or a pulse signal from a rotary encoder when the drive source for the processing-feed means 37 is a servo motor), as described above. The control means 10 controls the pulse laser beam oscillation means 522 so as to generate a pulse laser beam having an energy corresponding to a speed accelerated at the uniformly accelerated velocity shown in FIG. 10 while the chuck table 36, that is, the semiconductor wafer 20 moves from the processing-feed start position (m0) up to the first processing-feed position (m1). When the chuck table 36, that is, the semiconductor wafer 20 reaches the first processing-feed position (m1), the control means 10 controls the pulse laser beam oscillation means 522 so as to generate a pulse laser beam having a preset energy of 3 (J/sec) in the uniform velocity movement area from the first processing-feed position (m1) up to the second processing-feed position (m2). And, when the chuck table 36, that is, the semiconductor wafer 20 reaches the second processing-feed position (m2), the control means 10 controls the pulse laser beam oscillation means 522 so as to generate a pulse laser beam having an energy corresponding to a speed decelerated at the uniformly decreased velocity shown in FIG. 10 while the chuck table 36, that is, the semiconductor wafer 20 moves from the second processing-feed position (m2) up to the processing-feed end position (m3).

Thus, in the embodiment using the energy control map shown in FIG. 10, as the energy of the pulse laser beam for each amount of processing-feed is controlled based on the processing-feed rate for the processing-feed amount from the processing-feed start position up to the processing-feed end position of the chuck table 36, the energy of the pulse laser beam applied per unit distance along the dividing lines 201 of the semiconductor wafer 20 becomes uniform from the processing-feed start position up to the processing-feed end position. Therefore, in this embodiment, too, the area from the processing-feed start position (m0) up to the processing-feed end position (m3) becomes the processing area and there is no invalid stroke of the chuck table 36, that is, the semiconductor wafer 20, thereby making it possible to shorten the processing time and reduce the size of the whole apparatus.

What is claimed is:

1. A laser beam processing machine comprising:
a chuck table for holding a semiconductor wafer as a workpiece,
a laser beam application means for applying a pulse laser beam to the workpiece held on the chuck table,
a processing-feed means for processing-feeding the chuck table and the laser beam application means relative to each other, the processing-feed means controlling a processing-feed rate of the chuck table so as to accelerate it to reach a predetermined processing-feed rate in the course from a processing-feed start position to a first predetermined processing-feed position, to maintain the predetermined processing-feed rate at a uniform velocity in the course from the first predetermined processing-feed position to a second predetermined processing-feed position, and to decelerate the processing-feed rate to nil in the course from the second predetermined processing-feed position to a processing-feed end position, at the time of processing-feeding the chuck table,
an image pick-up means for detecting the coordinate values of the processing-feed start position and the processing-feed end position respectively after the processing-feed start position and the processing-feed end position are positioned right below the image pick-up means,
a feed amount detection means for detecting the processing-feed position of the chuck table, and
a control means for controlling the laser beam application means based on a detection signal from the feed amount detection means; wherein
the feed amount detection means comprises a linear scale arranged along a guide rail and a read head that is mounted on a first sliding block and moves along the linear scale with the first sliding block;
the control means comprises a storage means for storing a control map for setting the processing condition of a laser beam based on the processing-feed rate for the processing-feed position from the processing-feed start position to the processing-feed end position of the chuck table by the processing-feed means and outputs an application signal of the processing condition set by the control map to the laser beam application means based on a signal from the feed amount detection means.

2. The laser beam processing machine according to claim 1, wherein the control map is a frequency control map for setting a repetition frequency of a laser beam based on the processing-feed rate for the processing-feed position from the processing-feed start position to the processing-feed end position of the chuck table by the processing-feed means.

* * * * *